Figure 1:

United States Patent [19]
Shannon

[11] Patent Number: 5,262,980
[45] Date of Patent: Nov. 16, 1993

[54] OPTO-ELECTRONIC MEMORY SYSTEM

[75] Inventor: John M. Shannon, Whyteleafe, England

[73] Assignee: U.S. Philips Corporation, New York, N.Y.

[21] Appl. No.: 869,407

[22] Filed: Apr. 16, 1992

[30] Foreign Application Priority Data

Apr. 19, 1991 [GB] United Kingdom ............... 9108382

[51] Int. Cl.$^5$ .................................. G11C 11/42
[52] U.S. Cl. ................................. 365/108; 365/64; 365/112
[58] Field of Search ................ 365/108, 112, 64; 359/54, 55, 72, 53; 355/202, 244, 200

[56] References Cited

U.S. PATENT DOCUMENTS

| | | | |
|---|---|---|---|
| 3,515,880 | 6/1970 | Letter | 365/112 |
| 3,703,331 | 11/1972 | Goldmacher et al. | 365/108 |
| 4,859,035 | 8/1989 | Ichinose et al. | 359/63 |
| 4,984,198 | 1/1991 | Kobayashi et al. | 365/108 |
| 5,029,987 | 7/1991 | Shinomiya | 350/340 |

FOREIGN PATENT DOCUMENTS

| | | |
|---|---|---|
| 0117535 | 9/1984 | European Pat. Off. ............ 365/108 |
| 404575 | 12/1990 | European Pat. Off. . |
| 1304363 | 1/1973 | United Kingdom . |
| 2161632A | 1/1986 | United Kingdom . |
| 2193338 | 2/1988 | United Kingdom . |

Primary Examiner—Eugene R. LaRoche
Assistant Examiner—Son Dinh
Attorney, Agent, or Firm—David R. Treacy

[57] ABSTRACT

An electro-optic memory system includes reading means comprising a planar array of parallel linear electro-optic, e.g. LC, light shutters (16) which are illuminated with parallel light (11) and a parallel, spaced, planar array of light sensing elements, (18) e.g. thin film photodiodes, extending at right angles to the light shutters with read-out regions (20) being defined at the intersections of the shutters and sensing elements. A memory element (14) comprising a two dimensional array of memory locations in which information is stored in the form of a light transmission characteristic is disposed between the shutter and sensing element arrays with the memory locations aligned with read-out regions. Rows of memory locations are optically read, one at a time, for example in sequence, by selective operation of the light shutters by a drive circuit (42) and electrical outputs (43,45) obtained from the sensing elements (18) according to the characteristics of the corresponding row of memory locations. The memory element may comprise a photographic, photochromic or liquid crystal medium, in, for example, the form of a data card.

20 Claims, 2 Drawing Sheets

OPTO-ELECTRONIC MEMORY SYSTEM

This invention relates to opto-electronic memory systems comprising a memory element ill which information is stored in optically readable form and reading means for optically reading information in the memory element and providing electrical output in accordance therewith.

One well known form of opto-electronic memory system suitable for use in storing and retrieving data is the CD-ROM system in which information is stored on an optical disc and is read out by directing a laser beam over the disc and detecting the reflected beam which is modulated in accordance with the stored information. Reading is accomplished by scanning the laser beam over the disc which entails rotating the disc and moving a reading head radially of the disc. CD-ROM systems are capable of storing large amounts of information and accessing the information quickly. However, in using a laser scanning approach, the reading equipment is expensive and requires an electro-mechanical scanning arrangement including electric motors and an optical system, which limits its minimum size and demands an appropriate power supply, thus restricting its use and hindering its possible integration with other equipment, particularly portable information systems.

In an earlier proposal for an optical recording and playback system, as described in GB-A-1304363, it was suggested that information, in this case audio information, can be stored in a photographic film and read by means of a laser beam directed onto one side of the film and a detector disposed on the other side, in this proposal, the photographic film remains stationary and the laser beam is scanned over its surface by way of an electro-optic deflection system. The system also requires an optical system for directing and focusing the beam onto the film and for collecting light transmitted through the film and focusing it onto the detector, and accordingly suffers some of the drawbacks associated with CD-ROM systems.

More recently an optical data card system has been proposed in which data is stored in an easily portable and inexpensive memory card having an optically sensitive medium using a laser to write in the information. In GB-A-2161632 there is described a reader for reading information from such a card comprising a reader head which directs a beam of light onto the card and in which light reflected from the card, in accordance with stored information, is passed to a detector array. The card is moved in a first direction relative to the reader head under the control of an electric motor while the head is movable in a second direction at right angles to the first direction by an electromechanical actuator so as to enable stored information to be scanned. The reader therefore also suffers similar drawbacks to that of a CD-ROM system.

It is an object of the present invention to provide an opto-electronic memory system which is inexpensive and relatively simple to manufacture and to use.

It is another object of the present invention to provide an opto-electronic memory system which, for a given memory capacity, can be of comparatively small size and capable of use in portable equipment.

According to the present invention, there is provided an opto-electronic memory system comprising a planar memory element in which information is stored in a two dimensional array of memory locations having light transmission characteristics according to the stored information, and reading means for optically reading information in the memory element and providing an electrical output in accordance therewith, characterised in that the reading means comprises a planar array of linear electro-optic shutters disposed parallel to, and on one side of, the memory element with the linear electro-optic shutters extending parallel to one another in first direction, a planar array of linear light sensitive elements disposed parallel to, and on the other side of, the memory element with the linear light sensitive elements extending parallel to one another in a second direction perpendicular to said first direction, means for illuminating the array Of shutters, and a drive circuit for selectively operating the shutters.

It is to be understood that the term "light" used herein is intended to include non-visible parts of the spectrum such as infra-red.

In practice, the array of electro-optic shutters$ the array of light sensitive elements and the illumination means can be assembled together forming a reader unit. Read-out regions in a row and column matrix array are obtained at the intersections of the sets of linear shutters and linear light sensitive elements and information in memory locations of the memory element at positions corresponding to these read-out regions can be read. The memory element may be permanently disposed between the two arrays. Preferably, however, the arrays are assembled with provision for a memory element to be removably inserted in a defined space between the shutter and sensing element arrays.

The invention uses a solid state optical scanning approach to reading information stored in the memory element. In an embodiment of the memory system provided by the invention, scanning of the information stored in the memory element can be accomplished on a line by line basis using the electro-optical shutters and the need for electro-mechanical components, such as motors, and optical components, such as lenses, for directing and controlling a scanning light beam, are avoided. Consequently, the memory system is capable of being produced in a very compact form. The array of electro-optical shutters and the array of light sensitive elements need only occupy an area corresponding approximately to the information storage area of the memory elements. The memory element may, for example, have dimensions similar to those of a typical credit card.

The system can to be used in similar manner to conventional CD-ROM and magnetic floppy disc systems and for similar applications. The memory element could be used to store audio (e.g. music) information with the reading means providing an audio output signal as an alternative to an audio CD player. By virtue of its compactness and comparative simplicity, it is envisaged that the system can be integrated in various equipment and used for a wide range of purposes, for example in the manner of a smart card system.

By using a flood illumination means which produces highly collimated light directed substantially perpendicularly over the input side of the electro-optic shutter array and by minimising the spacing between the arrays of electro-optic shutters and the light sensitive elements, a high density of read-out regions can be achieved. Moreover, the need for optical elements such as lenses between the illumination means and the light sensitive element array is avoided.

The electro-optic shutters preferably comprise liquid crystal shutters, each shutter comprising an individual and separately controllable region of a liquid crystal panel. The shutters are opened when operated to allow light from the light source to pass therethrough, and hence onto the memory element, and are closed to block light when they are not selected. In order that the shutters be capable of providing most effective blocking of input light when not selected so as to achieve a desirable high on/off light contrast ratio, each shutter preferably comprises at least two liquid crystal elements arranged optically in series.

The light sensitive elements are preferably elongate thin film devices carried on a common support. The devices preferably comprise photodiodes, for example nip devices, although other kinds of devices which can be arranged to produce an electrical signal in response to light impinging thereon, for example photoresistive or photoconductive devices, could be used. The technology for producing such thin film devices is now well established, having been used in the production of large area light sensor arrays generally.

The use of thin film devices for the array of light sensitive elements and liquid crystal elements for the array of light shutters means that these components have comparatively small thicknesses. Consequently when arranged in their operative configuration with a gap therebetween in which the memory element is received, the overall thickness of the assembly need be only slightly greater than the combined thicknesses of these two components and the memory element. Moreover, the technology for liquid crystal shutter arrays and thin film light sensitive device arrays is such that these components can be produced inexpensively and reliably, and in a range of sizes to suit various sizes of memory element. As previously mentioned, the latter could be of credit card size, although if a larger memory capacity is required, larger elements can be used, for example six or ten inches square or even larger, as the technology available for the reading means components is readily capable of accommodating these dimensional requirements.

The memory element may comprise any suitable optical medium in which localised areas can be selectively rendered light transmissive, non-transmissive or partly transmissive, either permanently or reversibly, as a means for recording information. Such a medium may comprise photographic film. As alternatives, memory elements comprising photochromic material, liquid crystal polymer material, or encapsulated liquid crystal film could be used.

The benefit of using photographic film for the memory element is that it is inexpensive and enables mass production of memory elements easily through, for example, replication using a master element as a mask. Other forms of memory element, such as liquid crystal cells with pixel elements constituting memory locations, or photochromic elements may be more expensive but offer the advantage of being programmable as desired by writing in the information electrically or optically respectively.

The memory locations are arranged in rows and columns and of a size and pitch corresponding to the matrix of the read out regions constituted by the cross-over regions defined by the intersecting sets of electro-optic shutters and light sensitive elements. Thus, as each shutter is operated, a respective line of memory locations is illuminated and read.

The array of electro-optic shutters may be operated one at a time in turn so that lines, for example, rows, of memory locations are accessed by scanning in sequence. Alternatively, the reading means may be used in random row access manner by operating selectively any one or more shutters of the array to access particular information stored in the associated row of memory locations. As the reading means is entirely solid state and does not involve any electro-mechanical parts, the accessing of information in both modes of operation can be accomplished rapidly.

The information can be recorded in the memory element in binary form, with the regions of the medium defining individual memory locations being either transparent or opaque so that depending on the state of the memory location the part of the light sensitive element corresponding to a particular memory region is either illuminated or not upon operation of the shutter associated with that region. In this case the light sensitive elements need be capable only of providing an identifiable output in response to light input. It is envisaged, however, that information may be recorded in the form of a multi-level, quasi-analogue, optical transmission factor, in the manner of a grey scale, with individual memory locations providing one of a series of light attenuation levels ranging between substantially full transmission to opaque. In this case, however, the light sensitive elements need to be responsive to different levels of illumination to cause respectively different output signals in order to distinguish the information. If the light sensitive elements are adequately sensitive, then the information stored in the memory elements may be in the form of a continuously variable light transmission characteristic with the reader then providing a fully analogue type output for each memory location.

Figure 2:
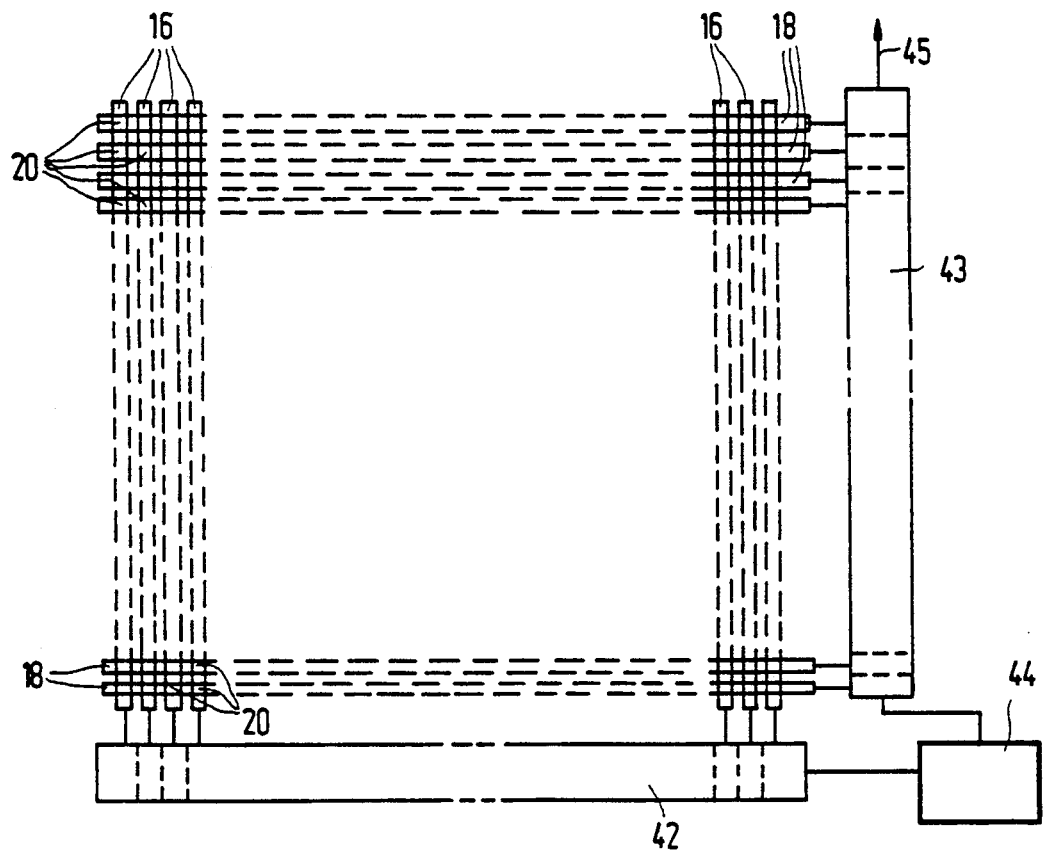
Figure 3:
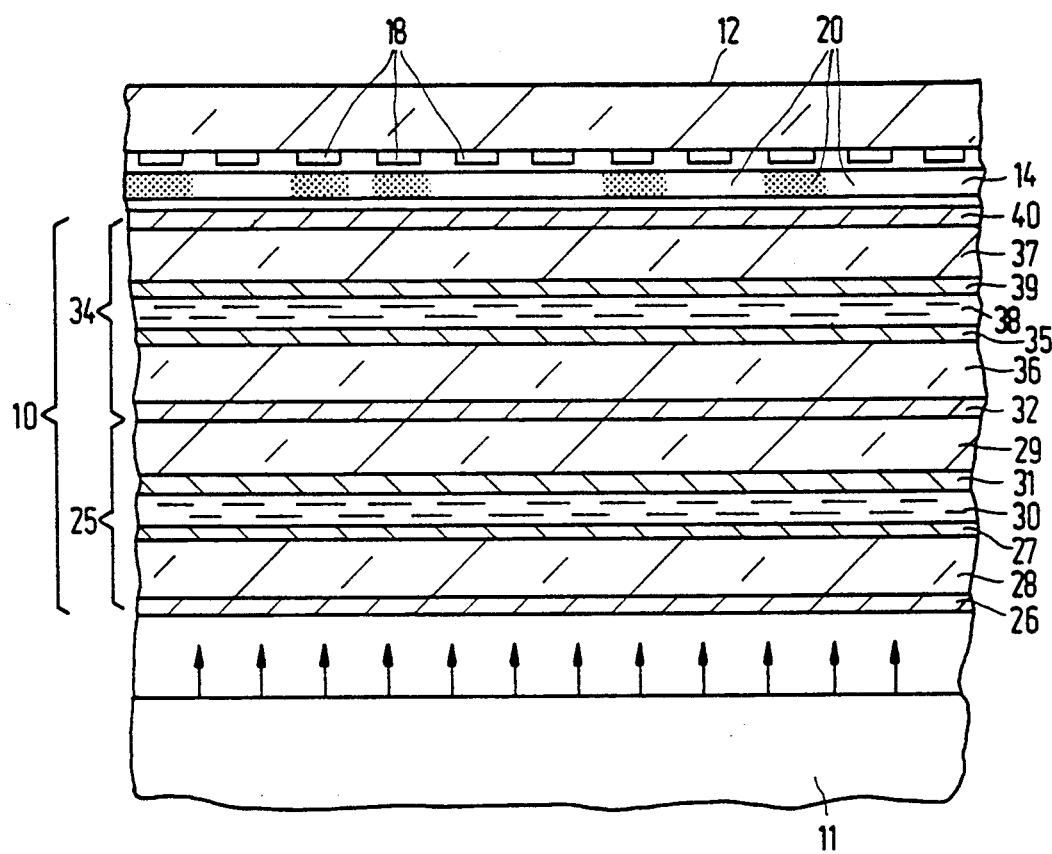

An embodiment of an opto-electronic memory system according to the invention will now be described, by way of example, with reference to the accompanying drawings, in which:

FIGS. 1 and 2 are respectively a schematic side view illustrating the disposition of the main components of the memory system and a diagrammatic plan view of the memory system; and FIG. 3 is a schematic cross-sectional view through a part of the memory system of FIG. 1.

It should be understood that the Figures are merely schematic and are not drawn to scale. In particular certain dimensions, such as the thicknesses of layers, may have been exaggerated whilst other dimensions may have been reduced.

The electro-optic memory system comprises a planar memory element in which optically readable information is stored in a two dimensional planar array of memory locations, and a reader unit for reading information from the memory element. Referring to FIG. 1, the reader unit comprises three juxtaposed main parts, namely an electro-optic scanner component 10, to which addressing signals are applied, an illumination component 11 for illuminating the scanning element with parallel light, and a light detector component 12 from which electrical output signals are obtained indicative of information stored in the memory element, referenced at 14.

Referring also to FIG. 2, from which the memory element has been omitted for clarity, the scanner component 10 comprises a two dimensional array of electro-optic shutters 16 which are of elongate strip shape and are arranged closely spaced and parallel to one another in a first direction, in this example a column direction.

The shutters are liquid crystal shutters and comprise respective regions of a single liquid crystal panel with each shutter being defined by respective control electrodes of strip shape. Each of the shutters is selectively operable to allow light to pass therethrough. The regions of the liquid crystal panel between adjacent shutters are masked with light absorbing material, so that the light shutter regions are clearly defined and separated.

The light detector component 12 comprises a two dimensional array of light sensitive elements 18 which are of elongate strip shape and arranged closely spaced parallel to one another. The elements 18 extend in a second direction at right angles to the shutters 16, i.e. in a row direction. The sets of shutters 16 and light sensitive elements 18 thus cross-over one another and define at their intersections read-out regions, for example as indicated at 20, whose size is determined by the dimensions of the overlapping portions of the respective shutters 16 and elements 18.

The light sensitive elements 18 are carried on a supporting planar substrate, for example of glass, and fabricated using thin film technology. In this embodiment the thin film elements consist of elongated photodiode devices formed as n-i-p structures using amorphous silicon material.

The scanner and light detector components 10 and 12 are disposed close together with the planes of their respective arrays of shutters 16 and light sensitive elements 18 parallel and with a small spacing slightly greater than the thickness of the memory element 14 so as to allow insertion and removal of the memory element and minimal spacings between the components 10 and 12 and the respective facing surfaces of the memory element 14.

The illumination component 11 comprises a flood light source which uniformly illuminates the entire input side of the scanner component 10. The component 11 provides highly collimated light, as indicated by the arrows in FIG. 1, which is directed onto the input side of the scanner component 10 substantially perpendicularly to its plane. The illumination component may take various forms, and can be similar to those known in the field of liquid crystal display devices for example comprising a two dimensional light source with reflectors and micro-lenses or a collimating film to provide a parallel light output.

The components 10, 11 and 12 are assembled and held together using any suitable supporting structure (not shown). In practice the supporting structure provides guides for the memory element which ensure that it is located with its plane parallel to the planes of the scanner and detector components 10 and 12 when inserted in the space between these components.

The memory element 14 comprises an information storage medium having a row and column array of memory locations whose size and positions correspond to the array of read-out regions 20 determined by the crossing arrays of shutters and light sensitive elements 18. The memory element is aligned with respect to the scanning and sensing arrays by the aforementioned guides so that its memory locations are appropriately in registration with the read-out regions. Information is stored in the memory locations of the memory element as bits in binary form with each memory location having two possible transmissive states, namely either opaque or transparent. In this example, a photographic film is employed as the storage medium. In practice the film would be supported and protected by covering layers of transparent plastics material.

FIG. 3 shows a cross-section schematic view through a part of the structure of a preferred form of reader unit containing the memory element. The scanner component 10 in this case consists of two liquid crystal cells arranged overlying one another and optically in series so that a high on/off contrast ratio is obtained from the shutters with good transmission characteristics in their on (open) states, and substantially complete blocking of light in their off (closed) states. The first cell, referenced at 25, comprises a pair of spaced glass plates 28 and 29 with twisted nematic liquid crystal material 30 sealed therebetween. The plate 28 carries on its outer surface a polariser 26 and on its inner surface a continuous ITO electrode layer 27 common to all shutters. The plate 29 carries on its surface facing the liquid crystal material a set of spaced, strip shape, ITO electrodes 31 (only one of which is visible) defining respective shutters and on its opposite face a second polariser 32. The second cell, referenced at 34, similarly comprises a pair of spaced glass plates 36 and 37 with twisted nematic liquid crystal material 38 therebetween. The plate 36 is disposed directly on the surface of the second polariser 32 and carries on its opposite side, facing the liquid crystal material, a set of spaced, strip-shape, ITO electrodes 35 which are aligned with the electrodes 31. The other plate 37 carries on its one side a continuous ITO electrode 39 common to all shutters and on its opposite side remote from the liquid crystal material a third polariser 40. Each pair of aligned electrodes 31 and 35 define co-extensive regions of the two liquid crystal cells which together constitute a respective liquid crystal shutter. Regions of the glass supports 29 and 36 intermediate the strip electrodes 31 and 35 carried thereon are covered with a black, light absorbing, matrix, not visible in FIG. 3. Each pair of aligned electrodes 31 and 35 are connected together at one end of the cells. By applying appropriate potentials to aligned electrodes 31 and 35 and common electrodes 27 and 39, and thus across the regions of the liquid crystal layers 30 and 38 lying therebetween, the portions of the cells determined by the strip electrodes 31 and 35 are rendered selectively transparent and opaque, as will be apparent to persons skilled in the art. By using regions of two liquid crystal cells optically in series in this manner shutters having an adequately high on/off obtained (light/dark) contrast ratio, for example around $10^4:1$, are obtained.

The shutters are arranged with the polariser 26 facing the parallel light output, represented by arrows in FIG. 3, of the illumination component 11 and with the polariser 40 immediately adjacent one side of the memory element 14, with a minimal intervening space, and with the other side of this element being immediately adjacent the light sensitive elements 18, again with minimal separation.

Referring again to FIG. 2, each aligned pair of strip electrodes 31 and 35 constituting a respective shutter 16 is connected to a respective output stage of a scan drive circuit 42 comprising a shift register. In similar manner, an electrode terminal of each of the light sensitive elements 18 is connected to a respective stage of an output register circuit 43. The electrodes 27 and 39 of the shutters and the other terminals of the elements 18 are connected to appropriate predetermined potentials. The circuits 42 and 43 are in turn connected to a timing and control circuit through which their operations are controlled and synchronised.

The shutters 16 are normally held in their off state to block light. The circuit 42 operates to switch in turn each shutter of the array to its transmissive state. By operating the shutters in sequence a narrow strip of parallel light, corresponding to the dimensions of the shutters, is in effect scanned in steps over the memory element. The passage of this light towards the detector component 12 is determined locally by the individual states of the memory locations in the memory element 14. Examples of the transparent and opaque states of the memory locations are indicated in FIG. 3 by clear and shaded portions respectively of the element 14. Thus, when a particular shutter 16 is opened, a strip of light is directed onto the corresponding column of memory locations and light will either pass onto the light sensitive elements 18 or not depending on whether the memory locations at the read-out regions 20 of the associated corresponding portions of respective elements 18 are transparent or opaque, either causing an electrical signal to be supplied to the associated stage of the output register circuit 43 or not as the case may be. In this way the bits of information stored in a column of memory locations in the memory element 14 are accessed and read out simultaneously to their respective stages of the output register circuit. The contents of the register stages are then fed to an output 45 in serial fashion. As each shutter is scanned in turn, the information in each column of memory locations is read out separately to the register circuit 43, and a serial output obtained at 45, in succession. In an alternative arrangement, the circuit 43 may instead be adapted to provide parallel outputs comprising bytes of information.

The information stored in memory location columns of the memory element is thus read out a column at a time in sequence by scanning the shutters 16 one after the other. It should be understood, however, that a random access mode of operation could instead be employed using a suitably modified drive circuit 42 whereby the shutters can be selected and operated separately as required so as to enable information stored in particular columns of memory locations to be accessed.

The capacity of the memory element is determined by its physical size and the density of its memory locations. To an extent these factors are dictated by the fabrication requirements of the scanner and light detector components of the read-out unit whose overall dimensions correspond to those of the array of memory locations. Arrays of liquid crystal shutters and amorphous silicon photodiodes of around 100 cms square are easily feasible. For applications requiring easily transportable memory elements, for example for storing personal information, then memory elements around the size of conventional credit cards would seem preferable. Considering, for simplicity, a memory element having a memory location array of around 6 cms square and assuming the shutters 16 and light sensitive elements 18 each are 6 cms in length and 5 micrometers in width and adjacent pairs of shutters 16 and elements 18 are spaced apart by 2 micrometers then around 6000 shutters and 6000 light sensitive elements can accommodated giving $36 \times 10^6$ read-out regions. Thus, a memory element of these dimensions is readily capable of holding 36 megabits of information.

It will be appreciated that in the foregoing description reference to columns and rows can be interchanged, the particular terms used in this description merely indicating directions depicted in the Figures.

Various modifications are possible to the above-described embodiment. For example, the memory element need not comprise a photographic film. Other media capable of storing information in optically addressable manner and operating in transmissive mode can be employed. For example a photochromic glass material may be used in similar manner to provide optically opaque and transparent memory locations. Like a photographic film, such a memory element can be programmed with information optically using a master mask enabling mass production of memory elements. As a further alternative, the memory element could comprise a matrix liquid crystal cell in which the memory locations are provided by individual pixels which have been set in either a transparent or opaque optical state. Such a cell may comprise a pair of transparent substates carrying crossing sets of row and column electrodes which define at their intersections individual pixels (memory locations). Using ferroelectric liquid crystal material, the states of the memory locations can be set by applying potentials selectively to the row and column conductors associated with particular memory locations. Polymer dispersed or encapsulated types of liquid crystal cells using flexible substrates, can be used for convenience to good effect without the requirement for polarisers. An example of such a medium is described in EP-A-404575. Another example of a potentially suitable medium, comprising a liquid crystal polymer material, is described in GB-A-2193338. This particular medium stores information using an optical addressing scheme.

Alternative forms of photodiodes can be used in the light detector element. Light sensitive devices other than photodiodes, for example photoresistors or photoconductors, photoelectric and photovoltaic devices fabricated as thin film structures on a supporting substrate and which are capable of providing an indicative electrical output in response to a predetermined light input can also be used.

The liquid crystal shutters 16 may be of a form known in the art different to the particular example described with reference to FIG. 3. Shutters comprising a single layer of liquid crystal material rather than stacked layers could be used provided they are able to exhibit an adequate contrast ratio in operation. Electro-optic shutters using ferroelectric liquid material, for example as described in EP-A-323231, can be employed.

It is envisaged also that forms of electro-optic shutters other than liquid crystal shutters could be used in the scanner element.

From reading the present disclosure, other modifications will be apparent to persons skilled in the art. Such modifications may involve other features which are already known in the fields of electro-optic shutters, thin film light sensitive devices and optical memory elements and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An opto-electronic memory system comprising a planar memory element in which information is stored in a two dimensional array of memory locations having light transmission characteristics according to the stored information, and reading means for optically reading information in the memory element and providing an electrical output in accordance therewith, characterised in that the reading means comprises a planar array of linear electro-optic shutters disposed parallel to, and on one side of, the memory element with the linear electro-optic shutters extending parallel to one another in first direction, a planar array of linear light sensitive elements disposed parallel to, and on the other side of, the memory element with the linear light sensitive elements extending parallel to one another in a second direction perpendicular to said first direction, means for illuminating the array of shutters, and a drive circuit for selectively operating the shutters.

2. A system according to claim 1, characterised in that the electro-optic shutters comprise liquid crystal shutters each of which comprises a respective, individually controllable, region of a liquid crystal panel.

3. A system according to claim 2, characterised in that each shutter comprises at least two liquid crystal elements arranged optically in series.

4. A system according to claim 3, characterised in that the light sensitive elements comprise elongate thin film devices carried on a common support.

5. A system according to claim 4, characterised in that each light sensitive element comprises a photodiode.

6. A system according to claim 4, characterised in that the memory element comprises a photographic medium.

7. A system according to claim 1, characterised in that the memory element comprises a photochromic medium.

8. A system according to claim 1, characterised in that the memory element comprises a liquid crystal medium.

9. A system according to claim 4 characterised in that the means for illuminating the array of shutters comprises a flood illumination device which directs light over an input side of the array of electro-optic shutters substantially perpendicularly t pl ne of the array.

10. A system according to claim 9, characterised in that the memory element is removably mounted between the electro-optic shutter and light sensitive element arrays of the reading means.

11. A system according to claim 6, characterized in that the means for illuminating the array of shutters comprises a flood illumination device which directs light over an input side of the array of electro-optic shutters substantially perpendicular to the plane of the array.

12. A system according to claim 11, characterized in that the memory element is removably mounted between the electro-optic shutter and light sensitive element arrays of the reading means.

13. A system according to claim 3, characterized in that the memory element comprises a photographic medium.

14. A system according to claim 13, characterized in that the means for illuminating the array of shutters comprises a flood illumination device which directs light over an input side of the array of electro-optic shutters substantially perpendicular to the plane of the array.

15. A system according to claim 14, characterized in that the memory element is removably mounted between the electro-optic shutter and light sensitive element arrays of the reading means.

16. A system according to claim 1, characterized in that the light sensitive elements comprise elongate thin film devices carried on a common support.

17. A system according to claim 16, characterized in that the memory element comprises a photographic medium.

18. A system according to claim 17, characterized in that the means for illuminating the array of shutters comprises a flood illumination device which directs light over an input side of the array of electro-optic shutter substantially perpendicular to the plane of the array.

19. A system according to claim 18, characterized in that the memory element is removably mounted between the electro-optic shutter and light sensitive element arrays of the reading means.

20. A system according to claim 1, characterized in that the memory element comprises a photographic medium.

* * * * *